(12) United States Patent
Lee et al.

(10) Patent No.: US 8,929,119 B2
(45) Date of Patent: Jan. 6, 2015

(54) MEMORY MODULE AND ON-DIE TERMINATION SETTING METHOD THEREOF

(71) Applicant: Samsung Electronics Co., Ltd., Suwon-si (KR)

(72) Inventors: Jaejun Lee, Seongnam-si (KR); Bo-Ra Kim, Seoul (KR); Jeonghoon Baek, Busan (KR)

(73) Assignee: Samsung Electronics Co., Ltd., Samsung-ru, Yeongtong-gu, Suwon-si, Gyeonggi-do (KR)

( * ) Notice: Subject to any disclaimer, the term of this patent is extended or adjusted under 35 U.S.C. 154(b) by 136 days.

(21) Appl. No.: 13/772,895

(22) Filed: Feb. 21, 2013

(65) Prior Publication Data

US 2013/0223123 A1 Aug. 29, 2013

(30) Foreign Application Priority Data

Feb. 23, 2012 (KR) .......................... 10-2012-0018568

(51) Int. Cl.
*G11C 13/00* (2006.01)
*G11C 5/06* (2006.01)
*G11C 7/10* (2006.01)

(52) U.S. Cl.
CPC ................ *G11C 5/06* (2013.01); *G11C 7/1045* (2013.01); *G11C 7/1057* (2013.01); *G11C 7/1084* (2013.01)
USPC ........................................ 365/63; 365/230.06

(58) Field of Classification Search
USPC ............................................ 365/63, 230.06
See application file for complete search history.

(56) References Cited

U.S. PATENT DOCUMENTS

| | | | |
|---|---|---|---|
| 6,963,941 B1 * | 11/2005 | Lee ................................ | 710/107 |
| 6,970,369 B2 | 11/2005 | Funaba et al. | |
| 7,023,719 B1 | 4/2006 | Hung et al. | |
| 7,234,099 B2 | 6/2007 | Gower et al. | |
| 7,449,914 B2 | 11/2008 | Kim et al. | |
| 7,498,834 B2 | 3/2009 | Kim | |
| 7,741,867 B2 | 6/2010 | Carr et al. | |
| 7,952,944 B2 | 5/2011 | Kim et al. | |
| 2004/0044808 A1 * | 3/2004 | Salmon et al. .................... | 710/8 |
| 2006/0129712 A1 | 6/2006 | Raghuram | |
| 2008/0120458 A1 | 5/2008 | Gillingham et al. | |
| 2009/0303768 A1 | 12/2009 | Nishio et al. | |
| 2011/0109361 A1 * | 5/2011 | Nishio ........................... | 327/170 |
| 2011/0163078 A1 | 7/2011 | Fukushima et al. | |

* cited by examiner

*Primary Examiner* — Michael Tran
(74) *Attorney, Agent, or Firm* — Muir Patent Consulting, PLLC

(57) ABSTRACT

A memory system includes a plurality of memory devices on a printed circuit board, each of the memory devices including a plurality of external pads; a plurality of connection terminals formed on the printed circuit board, and electrically connected to respective ones of the external pads; and a plurality of signal lines formed on the printed circuit board to connect the connection terminals with the external pads, each of the signal lines between a corresponding connection terminal and a corresponding external pad and having a length. The plurality of memory devices are arranged at different distances from the plurality of connection terminals, and each signal line that connects a connection terminal to an external pad of a memory device either is connected to or does not connect a stub resistor depending on a length of the line.

19 Claims, 12 Drawing Sheets

MEMORY MODULE AND ON-DIE TERMINATION SETTING METHOD THEREOF

CROSS-REFERENCE TO RELATED APPLICATIONS

This U.S. non-provisional patent application claims priority under 35 U.S.C. §119 to Korean Patent Application No. 10-2012-0018568, filed on Feb. 23, 2012, the entire contents of which are hereby incorporated by reference.

BACKGROUND

Example embodiments relate to memory modules, and more particularly, to a memory module providing high reliability while reducing the number of constituent elements, and an on-die termination setting method thereof.

As a semiconductor manufacturing process and a circuit technology have been developed, the bandwidth of DRAM chips is increasing and a transmission method of data is constantly in development. An increase of memory bandwidth may be directly related to an operation speed of an input/output interface circuit. The operation speed of an input/output interface circuit may be determined by signal integrity of a signal channel (DQ, DQS) and a timing margin of a transmission/reception circuit.

SDRAM, DDR1 SDRAM, DDR2 SDRAM and DDR3 SDRAM having multi drop bus structures have been developed to bandwidths of 333 Mbps, 400 Mbps, 800 Mbps and 1600 Mbps respectively. These types of memory systems may adopt a stub series terminated logic (SSTL) method as an input/output signaling method to improve signal integrity. According to that technology, a reflected wave causing mutual signal interference is generated because of impedance mismatch in a stub and thereby inter symbol interference (ISI) is generated. As a result, a reflected wave causing mutual signal interference seriously damages signal integrity, and a technology for suppressing a reflected wave may be used to reduce the signal interference.

SUMMARY

In one embodiment, a memory system includes a printed circuit board, a plurality of connection terminals formed on the printed circuit board, and a plurality of memory devices electrically connected to the plurality of connection terminals through a plurality of signal lines on the printed circuit board. The plurality of memory devices comprise: a first set of memory devices arranged in a first row of the printed circuit board; and a second set of memory devices arranged in a second row of the printed circuit board. A first memory device of the first set of memory devices is electrically connected to a first group of connection terminals of the plurality of connection terminals through a first group of signal lines, such that all of the connections between the first memory device of the first set of memory devices and connection terminals on the printed circuit board pass through the first group of signal lines. A first memory device of the second set of memory devices is electrically connected to a second group of connection terminals of the plurality of connection terminals through a second group of signal lines, such that all of the connections between the first memory device of the second set of memory devices and connection terminals on the printed circuit board pass through the second group of signal lines. No signal lines of the first group of signal lines connect to any stub resistors, and at least a first signal line of the second group of signal lines connects to a stub resistor.

In another embodiment, a memory module includes a printed circuit board (PCB) including a plurality of signal lines, and including a plurality of external connection terminals extending to a first edge of the PCB. The memory module further includes a plurality of memory devices mounted on the PCB, the plurality of memory devices including a first set of memory devices arranged in a first row and a second set of memory devices arranged in a second row further away from the plurality of external connection terminals than the first row. A first memory device is part of the first set of memory devices, the first memory device including a plurality of external device terminals. At least a first external device terminal of the first memory device is connected to circuitry of the first memory device configured to transmit a first type of signal. A second memory device is part of the second set of memory devices, the second memory device including a plurality of external device terminals. At least a first external device terminal of the second memory device is connected to circuitry of the second memory device configured to transmit the first type of signal. A first signal line is connected between the first external device terminal of the first memory device and a first external connection terminal of the plurality of external connection terminals, and no stub resistor is connected between the first external device terminal of the first memory device and the first external connection terminal of the plurality of external connection terminals. A second signal line is connected between the first external device terminal of the second memory device and a second external connection terminal of the plurality of external connection terminals, and a stub resistor is connected between the first external device terminal of the second memory device and the second external connection terminal of the plurality of external connection terminals.

In another embodiment, a memory system includes a plurality of memory devices on a printed circuit board, each of the memory devices including a plurality of external pads; a plurality of connection terminals formed on the printed circuit board, and electrically connected to respective ones of the external pads; and a plurality of signal lines formed on the printed circuit board to connect the connection terminals with the external pads, each of the signal lines between a corresponding connection terminal and a corresponding external pad and having a length. The plurality of memory devices are arranged at different distances from the plurality of connection terminals, and each signal line that connects a connection terminal to an external pad of a memory device either is connected to or does not connect a stub resistor depending on a length of the line.

BRIEF DESCRIPTION OF THE FIGURES

Various example embodiments will be described below in more detail with reference to the accompanying drawings.

DETAILED DESCRIPTION

Figure 1:
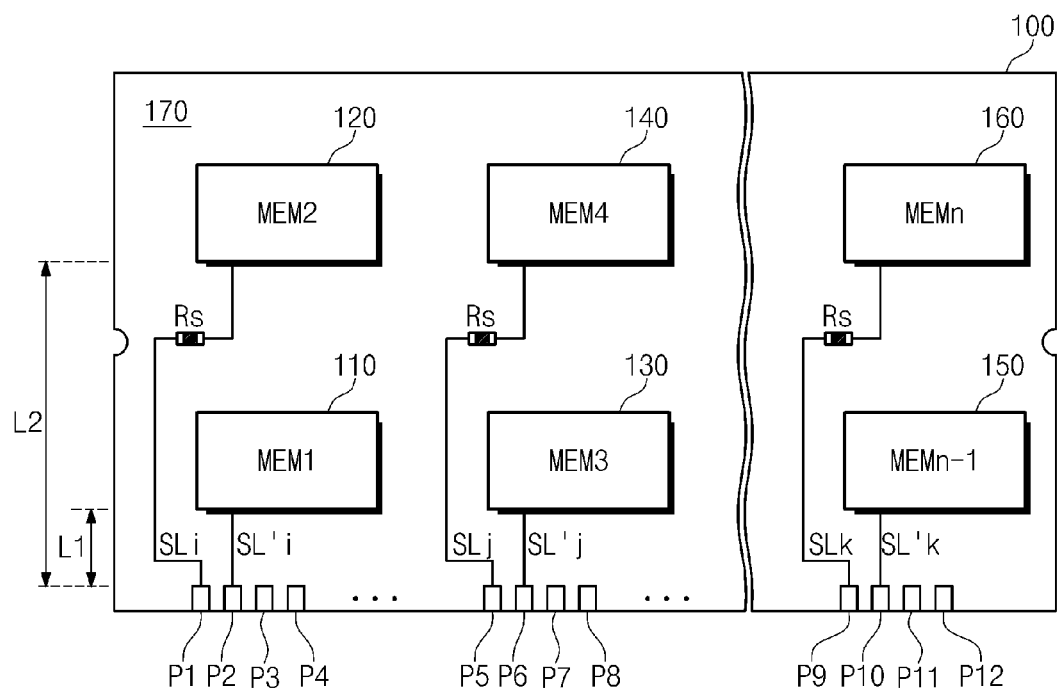
FIG. 1 is a drawing illustrating a memory system in accordance with example embodiments.

Various example embodiments will be described more fully hereinafter with reference to the accompanying drawings. The present disclosure may, however, be embodied in many different forms and should not be construed as limited to the embodiments set forth herein. In the drawings, the size and relative sizes of layers and regions may be exaggerated for clarity. Like numbers refer to like elements throughout.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms first, second, third, etc. may be used herein to describe various elements, components, regions, layers and/or sections, these elements, components, regions, layers and/or sections should not be limited by these terms. Unless indicated otherwise, these terms are only used to distinguish one element, component, region, layer or section from another element, component, region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein FIG. 1 is a drawing illustrating a memory system in accordance with example embodiments. Referring to FIG. 1, a memory system 100 includes a plurality of memory devices 110, 120, 130, 140, 150 and 160 and stub resistors Rs provided for impedance matching. The memory system 100 includes a plurality of connection terminals P1, P2, . . . , P12 used when the memory system 100 is placed in a slot. The plurality of memory devices 110, 120, 130, 140, 150 and 160 and the stub resistors Rs are mounted on a substrate 170.

The plurality of memory devices 110, 120, 130, 140, 150 and 160 may be, for example, semiconductor chips, stacked semiconductor chips, semiconductor packages, or package-on-package devices. Although the various embodiments are described in connection with memory devices, the principles of the disclosed embodiments may apply as well to semiconductor devices that are not necessarily memory devices, such as microprocessors, controllers, or other semiconductor devices mounted on a substrate.

The substrate 170 may be, for example, a printed circuit board (PCB). The PCB may include a plurality of signal lines (SL), as described further below. The signal lines include a conductive material, such a metal wire (e.g., formed of a plating material), connected to and configured to transfer signals between the memory devices 110-160 and connection terminals P1-P12 on the PCB.

In one embodiment, the plurality of memory devices 110, 120, 130, 140, 150, and 160 are fixed to an upper portion of the substrate 170. For example, the memory devices may be mounted on a first surface of the substrate 170. The memory system 100 may be a memory module. In one embodiment, memory devices 110-160 are arranged in rows on the substrate 170. For example, a first set of memory devices (e.g., 110, 130, 150) may be arranged in a first row on the substrate 170, and a second set of memory devices (e.g., 120, 140, 160) may be arranged in a second row on the substrate 170. In one embodiment, the plurality of connection terminals P1-P12 are arranged along a first edge of the PCB and may extend to the edge of the PCB. The connection terminals P1-P12 may be used to communicate between a main controller (not shown) external to the PCB, and the memory devices 110-160. The connection terminals may be formed of a metal plating layer or other conductive material. In certain embodiments, the connection terminals P1-P12 are pins for connecting to a slot in which the memory system may be inserted.

As shown in FIG. 1, in one embodiment, a first set of memory devices (e.g., 110, 130, and 150) are arranged in a first row and a second set of memory devices (e.g., 120, 140, and 160) are arranged in a second row further away from the plurality of external connection terminals P1-P12 than the first row. A first memory device (e.g. MEM1) of the first set of memory devices may be electrically connected to a first group of connection terminals (e.g., P2, P3, P4, and additional connection terminals not shown) of the plurality of connection terminals through a first group of signal lines (e.g., SL'i). All of the connections between the first memory device MEM1 and connection terminals on the printed circuit board may be between the first memory device MEM1 and the first group of connection terminals. In one embodiment, connections between the first memory device and connection terminals on the printed circuit board are all to connection terminals along a first edge of the PCB. The same may apply for other memory devices mounted on the PCB.

As shown in FIG. 1, the memory device 110 is connected to at least a first signal line SL'i. The first signal line SL'i may be part of a group of signal lines that connect the memory device 110 to connection terminals on the PCB. The memory device 120 is connected to at least a second signal line SLi. The signal lines SLi and SL'i can correspond to the same data line. For example, each signal line may be connected to respective terminal of a memory device that is used to transfer data. In one embodiment, the memory devices, such as 110 and 120 maybe identical devices. Each signal line SL'i and SLi may connect to a terminal on each memory device at a same location on the device. Each signal line SL'I and SLi may connect to a terminal on each memory device that is used to transfer the same type of signal (e.g., data signal, strobe signal, chip select signal).

A distance between the memory device 110 and the connection terminal P2 is different from a distance between the memory device 120 and the connection terminal P1. For example, the memory device 110 is spaced a distance L1 apart from the connection terminal P2. The memory device 120 is spaced a distance L2 apart from the connection terminal P1. Since the memory devices 110 and 120 have different separated distances from the connection terminals P1 and P2, a routing of the memory devices 110 and 120 should be provided considering the difference of separated distances.

In the memory system 100 in accordance with example embodiments, a stub resistor Rs is selectively provided to memory devices having different separated distances from the connection terminals P1 and P2. For example, a stub resistor Rs is not connected to a signal line between the connection terminal P2 and the memory device 110 having the separated distance L1 from the connection terminal P2. As such, the signal line may include only a wire and may not be connected to a stub resistor. A stub resistor Rs is connected to a signal line between the connection terminal P1 and the memory device 120 having the separated distance L2 longer than the separated distance L1 from the connection terminal P2. As such, the signal line may include a wire connected to a stub resistor. As mentioned above, the connection terminals P1 and P2 can correspond to data signal DQ, strobe signal DQS or chip select signal CS.

In one embodiment, no signal lines that connect a first memory device (e.g., MEM1) to the PCB connection terminals connect to stub resistors. At least a first signal line that connects a second memory device (e.g., MEM2) to the PCB connects a stub resistor. For example, in one embodiment, all data lines between the second memory device MEM2 and the PCB connection terminals connect to stub resistors, and no data lines between the first memory device MEM2 and the PCB connection terminals connect to stub resistors. A similar arrangement may apply for data strobe signal lines, or chip select signal lines.

As a result, each signal line that connects a connection terminal of the PCB to an external pad of a memory device either connects to or does not connect to a stub resistor depending on one or more of the type of signal line and a length of the signal line.

The providing principle of stub resistor Rs applied to the memory devices 110 and 120 can be equally applied to the memory devices 130 and 140 and the memory devices 150 and 160. In the embodiment shown in FIG. 1, the memory devices 110, 120, 130, 140, 150 and 160 are arranged in two rows on the substrate 170. However, the disclosure is not limited thereto and different stub resistors may be provided to memory devices arranged in three or more rows or in other patterns. In one embodiment, for example, when the memory devices are arranged in three rows, each of stub resistors provided to memory devices arranged in third rows may have a greater resistance than that of each of stub resistors provided to memory devices arranged in second rows.

Figure 2:
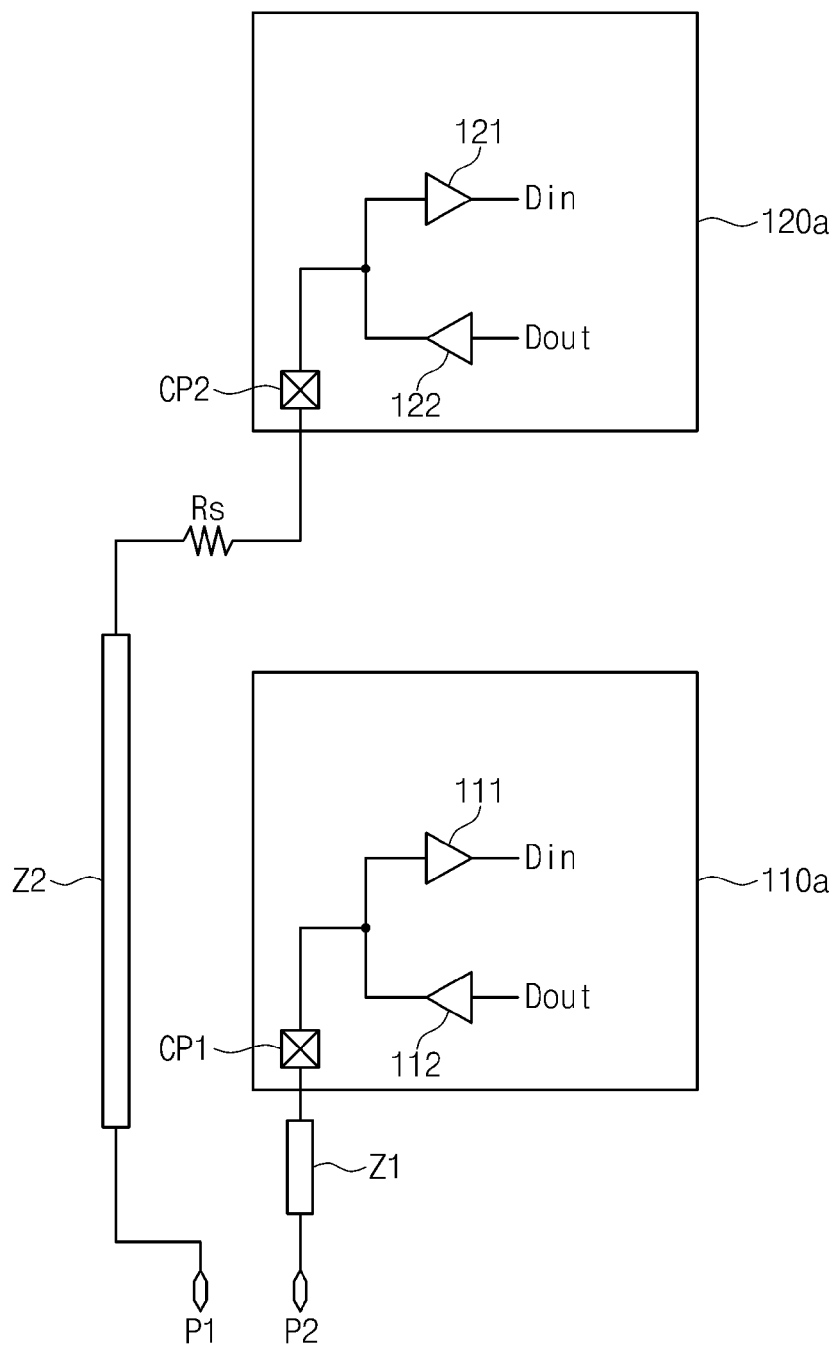
FIG. 2 is a block diagram illustrating memory devices and a stub resistor of in FIG. 1 in detail according to one exemplary embodiment.

FIG. 2 is a block diagram illustrating memory devices and a stub resistor of FIG. 1 in detail according to one embodiment. Referring to FIG. 2, a memory device 110a is electrically connected to the connection terminal P2 by a signal line of impedance Z1. A memory device 120a is electrically connected to the connection terminal P1 by a signal line of impedance Z2. The memory devices 110a and 120a may include input/output buffers 111, 112 and input/output buffers 121, 122 respectively. The signal lines shown in FIGS. 1, 2, and other figures, and referred to herein may include a first part that contacts a connection terminal of the PCB and a second part that contacts a device terminal of a memory device. Some of the signal lines may be connected to stub resistors, and other signal lines may not be connected to stub resistors. However, the term signal line referred to herein may also refer to a portion of a line, for example, between a stub resistor and a connection terminal of the PCB where a stub resistor is used.

The memory device 110a mounted in close vicinity to the connection terminal P2 is connected to the connection terminal P2 by a signal line of impedance Z1. The memory device 110a has an external terminal, such as a chip pad CP1, and the input buffer 111 and the output buffer 112 are connected to the chip pad CP1. The chip pad may be formed of a conductive material and may be connected to the circuitry within the memory device 110a to transmit signals to and from the memory device 110a.

The memory device 120a mounted to be spaced a relatively long distance apart from the connection pin P1 as compared with the memory device 110a is connected to the connection pin P1 by a signal line of impedance Z2 and a stub resistor Rs. The memory device 120a has an external terminal, such as a chip pad CP2, and the input buffer 121 and the output buffer 122 are connected to the chip pad CP2. The chip pad may be formed of a conductive material and may be connected to the circuitry within the memory device 120a to transmit signals to and from the memory device 120a.

When considering the memory system 100 positioned in a connector such as a slot, the memory devices 110a and 120a may connected through specific signal lines to the connection terminals P1 and P2. A signal line of impedance Z1 may be formed on a printed circuit board (PCB) and the connection terminal P2 and the chip pad CP1 of the memory device 110a are connected to each other. A signal line of impedance Z2 and a stub resistor Rs are provided on a printed circuit board (PCB) and the connection terminal P1 and the chip pad CP2 of the memory device 120a are connected to each other. The stub resistor Rs is provided to compensate impedance of the signal line. Thus, if a separated distance between the memory device 110a and the connection terminal P2 is minimized on the PCB substrate, signal integrity can be maintained without provision of stub resistor.

Through the composition described above, whether the stub resistor Rs is built in a signal line or not is determined by a relative distance between the connection terminal and the memory device. If the connection terminals P1 and P2 are a control signal pin (e.g., chip select signal CS), the input buffer and the output buffer may be replaced with an amplifier or an input/output driver. If the memory device 110a is built in close vicinity to the connection terminal P2 through an optimum arrangement, stub resistor Rs demand may be reduced. Thus, a routing and a loading space of printed circuit board constituting the memory system 100 can be obtained and production costs can also be reduced.

Figure 3:
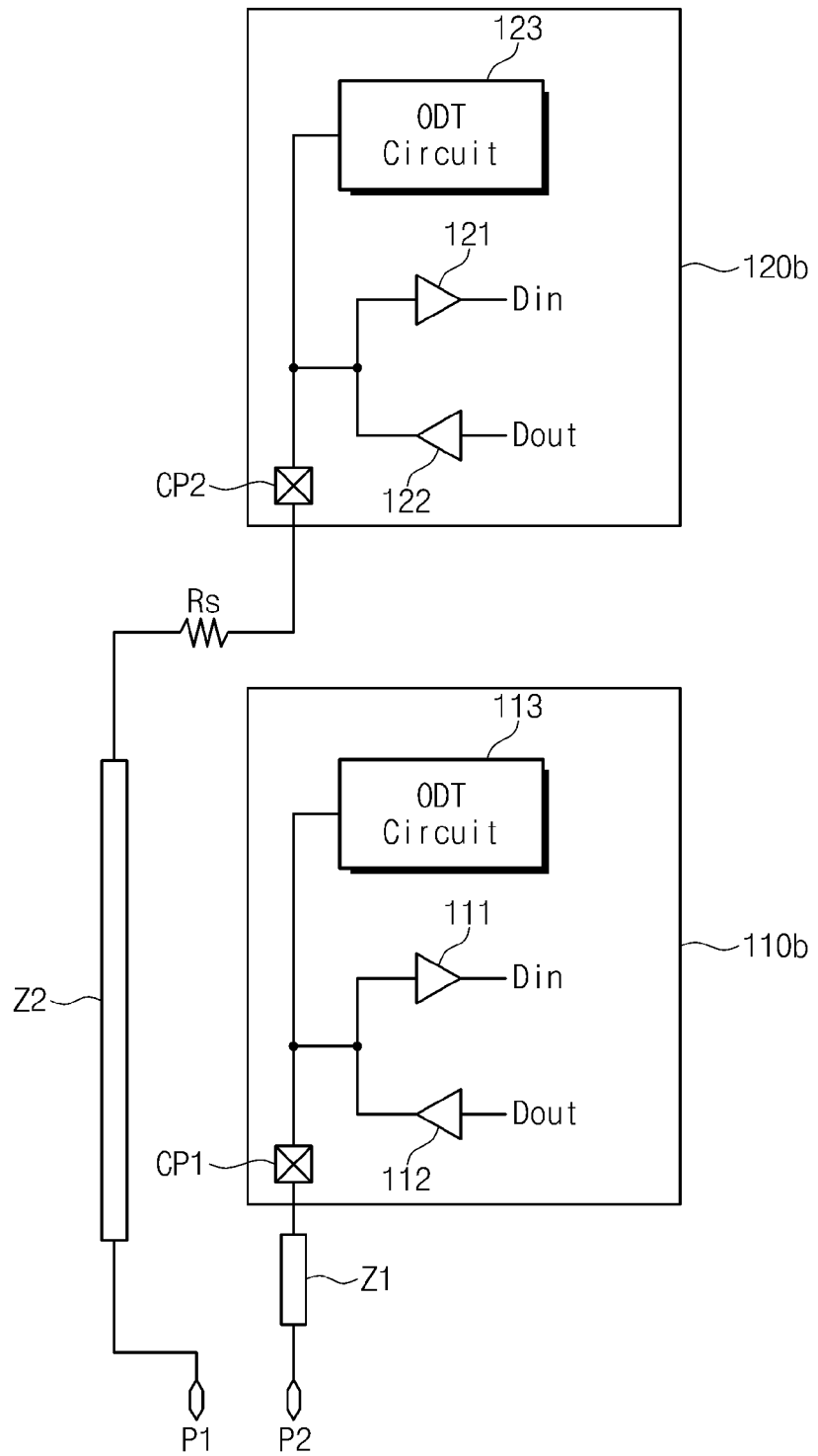
FIG. 3 is a block diagram illustrating some other exemplary embodiments of the memory system of FIG. 1.

FIG. 3 is a block diagram illustrating some other embodiments of the memory system of FIG. 1. Referring to FIG. 3, a memory device 110b is electrically connected to the connection terminal P2 by a signal line of impedance Z1. A memory device 120b is electrically connected to the connection terminal P1 by a signal line of impedance Z2. The memory devices 110b and 120b may include input/output buffers 111, 112 and input/output buffers 121, 122 respectively. The memory devices 110b and 120b may include on-die termination circuits 113 and 123 respectively which are set to different terminating resistances.

The memory device 110b is spaced a relatively short distance apart from the connection pin P2 as compared with the memory device 120b. The memory device 110b is connected to the connection terminal P2 through a signal line of impedance Z1. The memory device 110b has an external terminal, such as a chip pad CP1, and the input buffer 111 and the output buffer 112 are connected to the chip pad CP1. The memory device 110b may include an on-die termination (ODT) circuit 113. The ODT circuit 113 is a means for performing an impedance matching of a channel through a control of terminating resistance. In certain embodiments, the ODT circuit 113 increases signal integrity by minimizing a reflectance of signal through a control of a terminating resistance.

The memory device 120b mounted to be spaced a relatively long distance apart from the connection terminal P1 as compared with the memory device 110b is connected to the connection terminal P1 by a signal line of impedance Z2 and a stub resistor Rs. The memory device 120b may include an on-die termination (ODT) circuit 123. The memory device 120b has an external terminal, such as a chip pad CP2, and the input buffer 121, the output buffer 122, and the OUT circuit 123 are connected to the chip pad CP2.

Through the composition described above, whether the stub resistor Rs is connected to a signal line or not is determined by a relative distance between the connection terminal and the memory device. If the connection terminals P1 and P2 are a control signal pin (e.g., chip select signal CS), the input buffer or the output buffer may be replace with an amplifier or an input/output driver. The ODT circuits 113 and 123 included in the memory devices 110b and 120b respectively may be controlled to have different terminating resistances from each other.

A terminating resistance at an input/output terminal for different signals (e.g., data or control signals) can be controlled through the ODT circuits 113 and 123. A characteristic of signal transmission can be improved by minimizing a reflectance of signal lines through a control of the terminal resistance. When using the ODT circuits 113 and 123, data integrity increases but an increase of power consumption is inevitable. A terminal resistance of the ODT circuit 113 of the memory device 110b can be increased because of an absence of stub resistor Rs between the connection pin P2 and the memory device 110b.

The ODT circuit 113 of the memory device 110b can be set to have a relatively high ODT resistance, compared to, for example, an ODT circuit connected to a line that is connected to a stub resistor Rs. This is because the memory device 110b is spaced a short distance apart from the connection pin P2 and thereby an electrical connection by a stub resistor Rs is not needed. Because of an absence of stub resistor Rs, a terminal resistance set in the ODT circuit 113 of the memory device 110b can be increased. Thus, as a resistance of the ODT circuit 113 increases, a standby current flowing through the ODT circuit 113 may be reduced. It is fine that a set value of terminal resistance of the ODT circuit 123 included in the memory device 120b maintains the value initially set. As such, a terminal resistance of the ODT circuit 123 is set to be smaller than a terminal resistance of the ODT circuit 113.

Figure 4A:
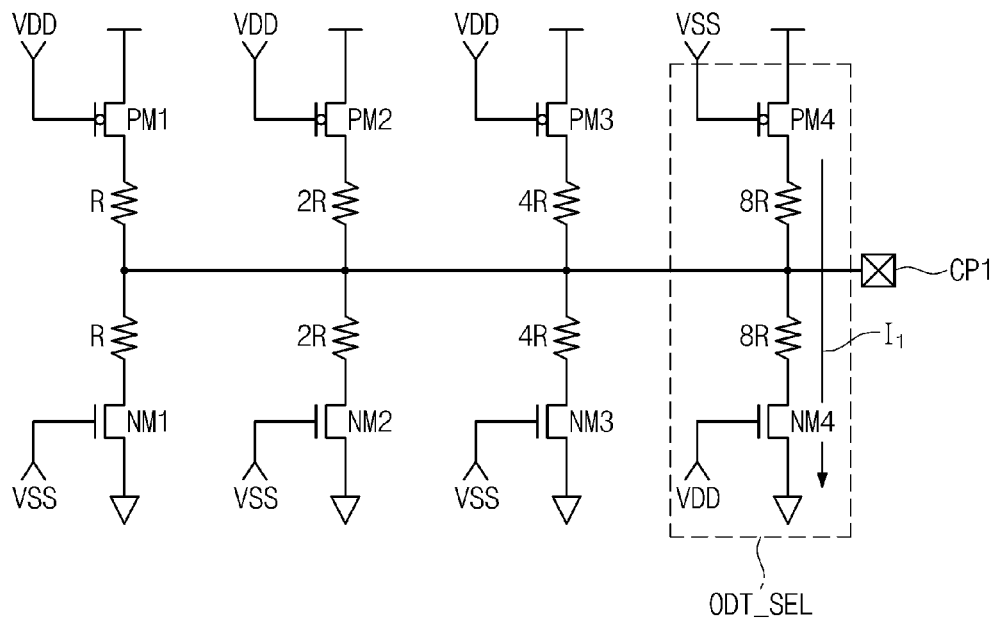
FIGS. 4A and 4B are example circuit diagrams illustrating ODT circuits of FIG. 3 as an illustration according to exemplary embodiments.
Figure 4B:
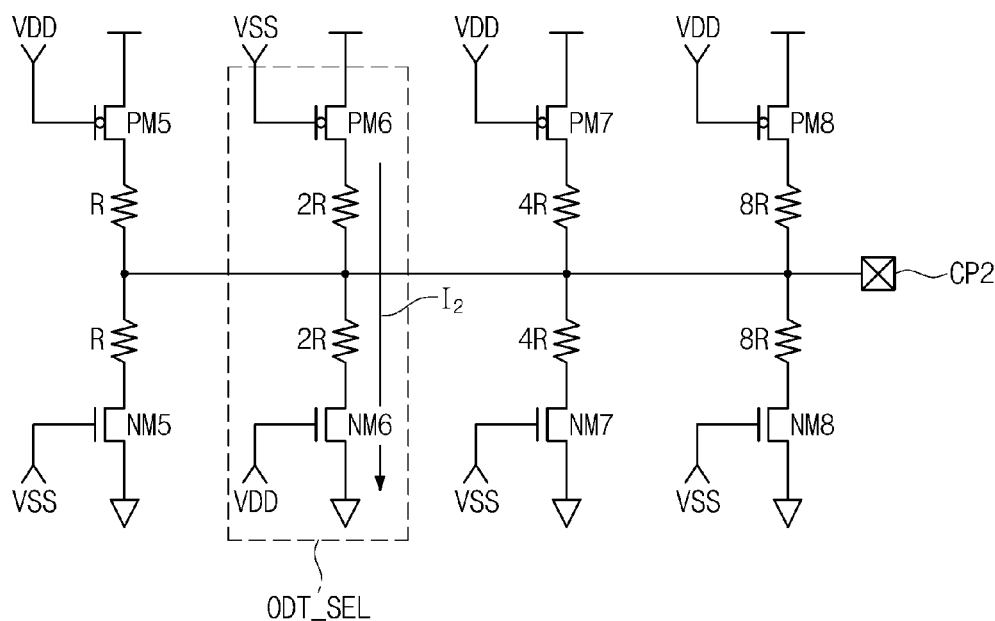

FIGS. 4A and 4B are exemplary circuit diagrams illustrating ODT circuits of FIG. 3 as an illustration. FIG. 4A is the ODT circuit 113 of the memory device 110b and FIG. 4B is the ODT circuit 123 of the memory device 120b.

Referring to FIG. 4A, the ODT circuit 113 includes a plurality of resistors R, 2R, 4R and 8R and switches PM1~PM4 and NM1~NM4 to control impedance of input/output line connected to the chip pad CP1. ODT control codes for controlling switches are provided to gates of the switches. The switches PM1~PM4 and NM1~NM4 may be constituted by a PMOS transistor and an NMOS transistor respectively.

When the memory system 100 is powered on or is initialized, if ODT control codes (e.g., VDD level or VSS level) which are previously set are provided to pull-up switches PM 1~PM4, pull-up resistors are set to have selected resistances. If ODT control codes (e.g., VDD level or VSS level) which are previously set are provided to pull-down switches NM1~NM4, sizes of pull-down resistors may be set.

A terminating resistance of the ODT circuit 113 may be set to be higher than a terminating resistance of the ODT circuit 123. Assume that an ODT control code is provided to the ODT circuit 113 of the memory device 110b so that the pull-up resistor 8R and the pull-down resistor 8R are selected. Then, the pull-up switch PM4 and the pull-down switch NM4 are turned on and the rest of the switches PM1~PM3 and NM1~NM3 are turned off. If the ODT circuit 113 is activated, a first standby current $I_1$ flows through the selected resistor 8R.

Referring to FIG. 4B, the ODT circuit 123 includes a plurality of resistors R, 2R, 4R and 8R and switches PM5~PM8 and NM5~NM8 to control impedance of the input/output line connected to the chip pad CP2. ODT control codes for controlling switches are provided to gates of the switches. The switches PM5~PM8 and NM5~NM8 may be constituted, for example, by a PMOS transistor and an NMOS transistor respectively.

When the memory system 100 is powered on or is initialized, if ODT control codes (e.g., VDD level or VSS level) which are previously set are provided to pull-up switches PM5~PM8, pull-up resistors are set to have selected resistances. If ODT control codes (e.g., VDD level or VSS level) which are previously set are provided to pull-down switches NM5~NM8, sizes of pull-down resistors may be set.

A terminating resistance of the ODT circuit 123 may be set to be lower than a terminating resistance of the ODT circuit 113. Assume that an ODT control code is provided to the ODT circuit 123 of the memory device 120b so that the pull-up resistor 2R and the pull-down resistor 2R are selected. Then, the pull-up switch PM6 and the pull-down switch NM6 are turned on and the rest switches PM5, PM7 and PM8 and NM5, NM7 and NM8 are turned off. If the ODT circuit 123 is activated, a second standby current $I_2$ flows through the selected resistor 2R.

The standby currents $I_1$ and $I_2$ have different values from each other. In one embodiment, the standby current $I_1$ is smaller than the standby current $I_2$. Thus, a power consumed in the ODT circuit 113 may be reduced.

Figure 5:
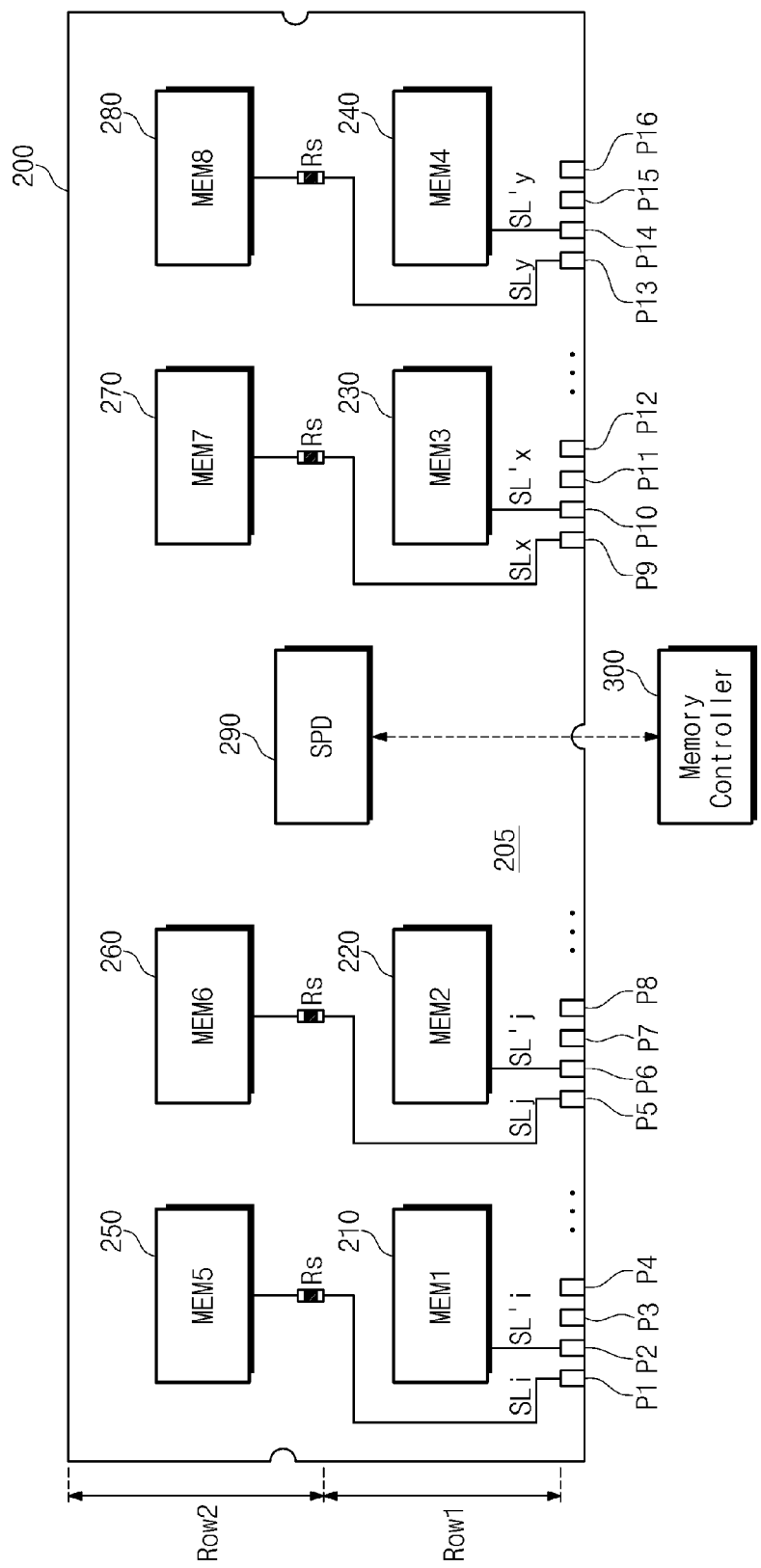
FIG. 5 is a block diagram illustrating a memory system in accordance with example embodiments.

FIG. 5 is a block diagram illustrating a memory system in accordance with certain exemplary embodiments. Referring to FIG. 5, a memory system 200 includes memory devices 210~280 mounted on a PCB substrate 205 and a series constitution perception device (SPD) 290. The SPD 290 stores a state of the memory system 200 to provide it to a memory controller 300. Information about row of the memory devices 210~280 is stored in the SPD 290. The SPD 290 stores information about whether each of the memory devices 210~280 is connected to a stub resistor Rs or not. The information is provided to the memory controller 300. With reference to the information, the memory controller 300 may differently set a set value of each of ODT circuits of the memory devices 210~280 according to a row wherein each memory device is located.

In one embodiment, the plurality of memory devices 210~280 are fixed to the PCB substrate 205. The plurality of memory devices 210~280 may be arranged in a row or in a column on the PCB substrate 205. The plurality of memory devices 210~240 may a first row (Row_1) on the PCB substrate 205. The plurality of memory devices 250~280 may a second row (Row_2) on the PCB substrate 205. The stub resistor Rs is not inserted for the memory device 210 which is located relatively in close vicinity to the connection pins P1, P2, P3 and P4. The stub resistor Rs may be inserted for the memory device 250 spaced a relatively long distance apart from the connection pins P1, P2, P3 and P4. The insertion principle of stub resistor Rs is also applied to the memory devices (220, 260), (230, 270) and (240, 280). The stub resistor Rs may be added to a signal line of the memory devices 250~280 corresponding to the second row (Row_2).

The memory controller 300 can differently set terminating resistances (e.g., ODT resistances) of the memory devices 210~280 according to a row. The memory controller 300 may differently set ODT resistances of the memory devices 250~280 including the stub resistor Rs in a signal path between the memory devices 250~280 and the connection terminals and ODT resistances of the memory devices 210~240 not including the stub resistor Rs in a signal path between the memory devices 210~240 and the connection pins. The ODT resistances of the memory devices 210~240 not including the stub resistor Rs in a signal path between the to the memory devices 210~240 and the connection terminals may be set to be relatively high compared to the ODT resistances of the other memory devices 250~280.

When the memory system 200 is initialized or powered on, the memory controller 300 can perform an ODT setting on the memory devices 210~280. The memory controller 300 can perform an ODT setting on the memory devices 210~280 through a control signal, a command or a mode register set (MRS).

The memory controller 300 may maintain ODT set values of the memory devices 250~280 at a default value and may set ODT set values of the memory devices 210~240 to be a value greater than the default value. The ODT set values of the memory devices 210~240 may be set to be a value for maximizing signal integrity considering a distance between the connection terminals P1~P16 and the memory devices 210~240 and characteristic impedance. Even though selecting the optimum ODT resistance being set for signal integrity, since the stub resistor Rs does not exist in a signal path between the connection terminals P1~P16 and the memory devices 210~240, the ODT resistance is higher than the ODT resistance of the memory devices 250~280. By the high ODT resistance, a standby power consumed in the memory devices 210~240 may be reduced.

Figure 6:
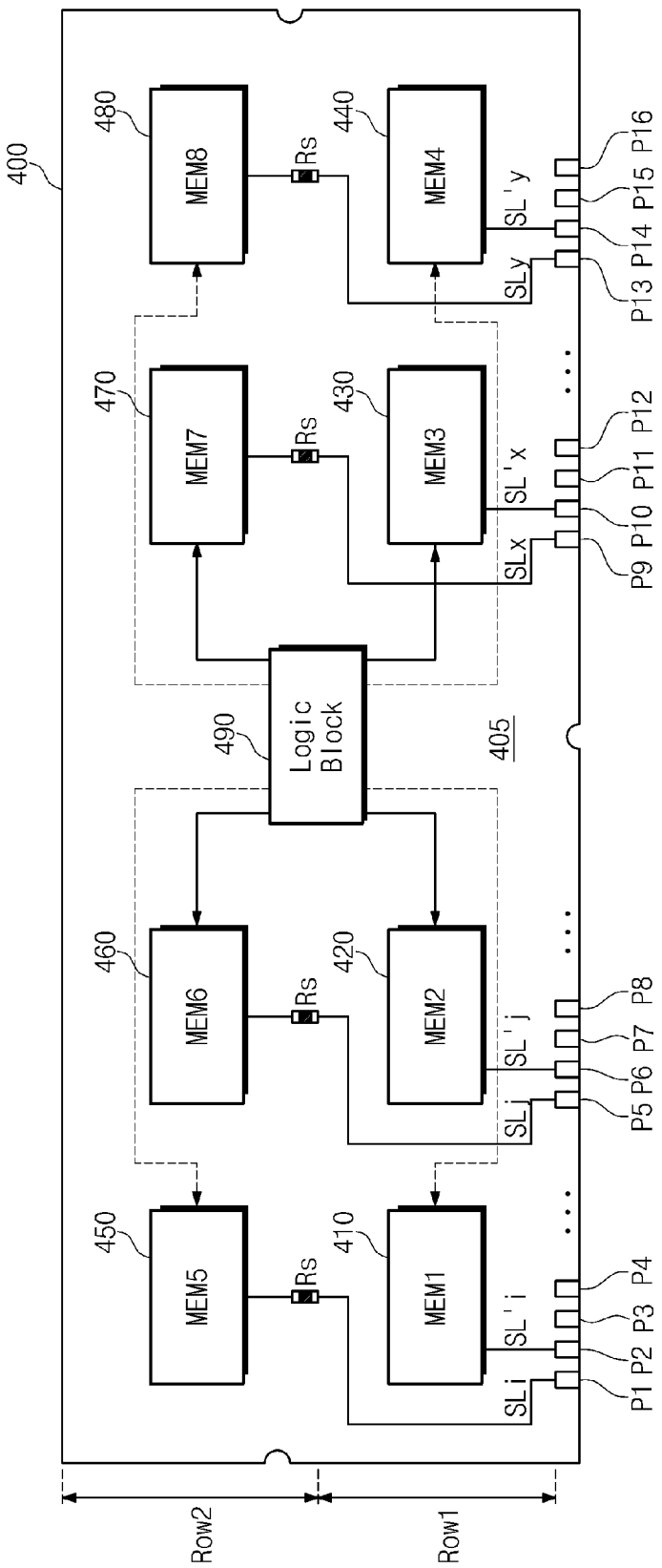
FIG. 6 is a block diagram illustrating a memory system in accordance with other exemplary embodiments.

FIG. 6 is a block diagram illustrating a memory system in accordance with some other exemplary embodiments. Referring to FIG. 6, a memory system 400 includes memory devices 410~480 mounted on a PCB substrate 405 and a logic block 490. The logic block 490 can control operation parameters of the memory devices 410~480 according to a row. The logic block 490 may differently set a set value of each of ODT circuits of the memory devices 410~480 according to a row in which the memory devices are located.

In one embodiment, the plurality of memory devices 410~480 are fixed to the PCB substrate 405. The plurality of memory devices 410~480 may be arranged in a row or in a column on the PCB substrate 405. The plurality of memory devices 410~440 may be located in a first row (Row_1) on the PCB substrate 405. The plurality of memory devices 450~480 may be located in a second row (Row_2) on the PCB substrate 405. The stub resistor Rs is not inserted for the memory device 410, which is located relatively in close vicinity to the connection pins P1, P2, P3 and P4. The stub resistor Rs may be inserted for the memory device 450 spaced a relatively long distance apart from the connection pins P1, P2, P3 and P4. The insertion principle of stub resistor Rs is also applied to the memory devices (420, 460), (430, 470) and (440, 480). The stub resistor Rs may be added to a signal line of the memory devices 450~480 corresponding to the second row (Row_2). The logic block 490 can differently set terminating resistances (e.g., ODT resistances) of the memory devices 410~480 according to a row. The logic block 490 may differently set ODT resistances of the memory devices 450~480 including the stub resistor Rs in a signal path between the memory devices 450~480 and the connection terminals and ODT resistances of the memory devices 410~440 not including the stub resistor Rs in a signal path between the memory devices 410~440 and the connection terminals. The ODT resistances of the memory devices 410~440 not including the stub resistor Rs in a signal path between the to the memory devices 410~440 and the connection terminals may be set to be relatively high.

The logic block 490 can perform an ODT setting on the memory devices 410~480 when the memory system 400 is initialized or is powered on. The logic block 490 can perform an ODT setting on the memory devices 410~480 through a control signal or a command, or a mode register setting (MRS).

The logic block 490 may maintain an ODT set value of the memory devices 450~480 at a default value and may set ODT set values of the memory devices 410~440 to be a value greater than the default value. The ODT set values of the memory devices 410~440 may be set to be a value for maximizing signal integrity considering a distance between the connection terminals P1~P16 and the memory devices 410~440 and characteristic impedance. Even though selecting the optimum ODT resistance being set for signal integrity, since the stub resistor Rs does not exist in a signal path between the connection terminals P1~P16 and the memory devices 410~440, the ODT resistance is higher than the ODT resistance of the memory devices 450~480. By the high ODT resistance, a standby power consumed in the memory devices 410~440 may be reduced.

Figure 7:
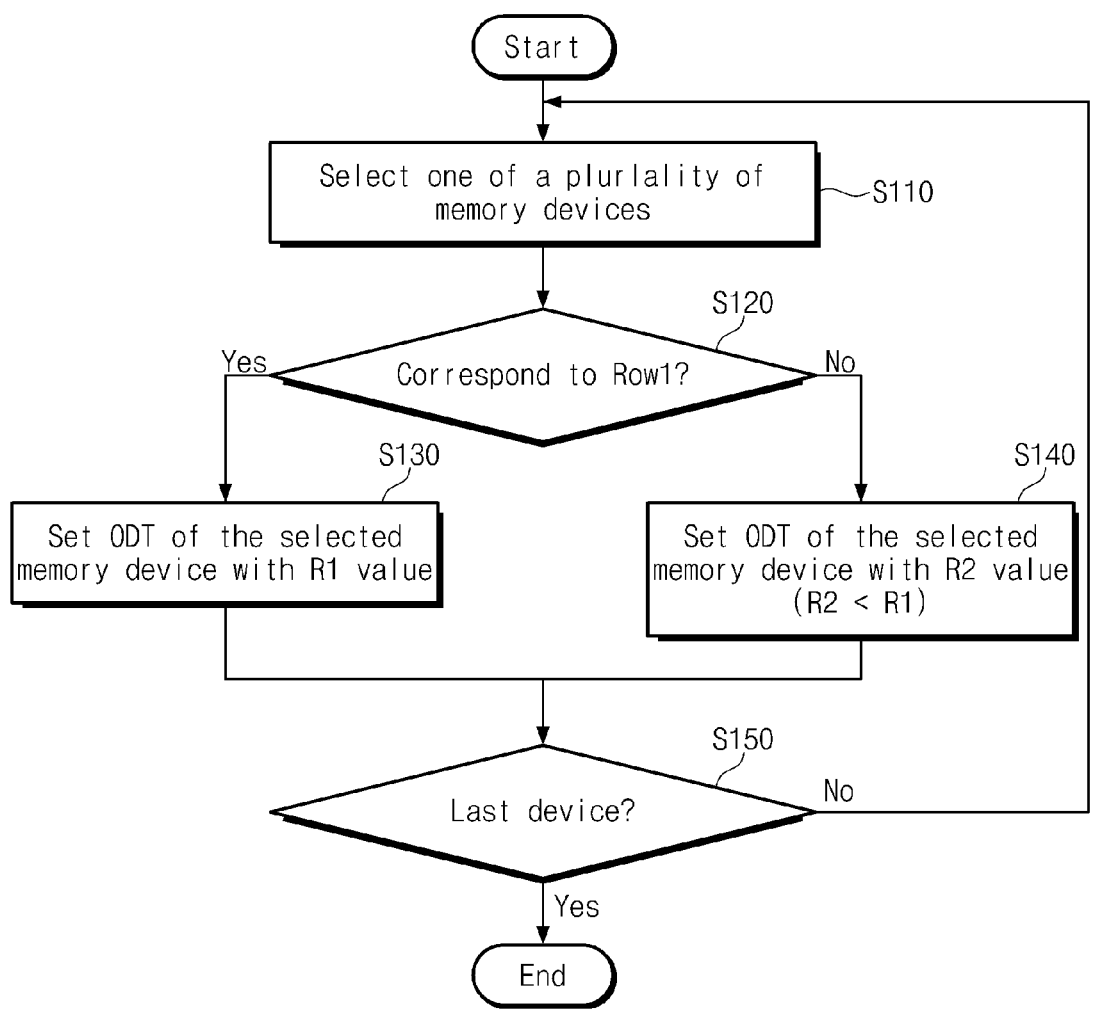
FIG. 7 is a flow chart showing an ODT setting method performed in the memory system of FIG. 5 or FIG. 6 according to one exemplary embodiment.

FIG. 7 is a flow chart showing an exemplary ODT setting method performed in the memory system of FIG. 5 or FIG. 6. Referring to FIG. 7, the memory system 200 or 400 may set OUT circuits of the memory devices to have different resistances according to a row. When the memory system is initialized or powered on, ODT circuits of the memory devices are set.

In S110, the memory controller 300 or the logic block 490 selects one of a plurality of memory devices 210~280 or 410~480. The memory controller 300 or the logic block 490 may select two or more memory devices at a time.

In S120, the memory controller 300 or the logic block 490 judges which row the selected memory device corresponds to. In one embodiment, a judgment on an arrangement location (row) of the selected memory device is described as an illustration but the inventive concept is not limited thereto. For example, in step S120, a separation distance between the selected memory device and a connection pin can be detected or whether or not a stub resistor Rs is provided between a connection terminal and the selected memory device can be detected. If the selected memory device corresponds to a first row Row_1 or is connected to a connection terminal without a stub resistor Rs, a process moves to S130. If the selected memory device corresponds to a second row Row_2 or is connected to a connection terminal through a stub resistor Rs, a process moves to S140.

In step S130, the memory controller 300 or the logic block 490 sets an ODT resistance of the selected memory device to be an ODT resistance R1 greater than a default value R2 for memory devices connected to a stub resistor Rs. The memory controller 300 or the logic block 490 can provide a command or a control signal to the selected memory device to perform the ODT setting.

In the S140, the memory controller 300 or the logic block 490 controls the selected memory device so that an ODT resistance of the selected memory device is provided to be the default value R2 for memory devices connected to a stub resistor Rs. The memory controller 300 or the logic block 490 may not perform a separate set operation when an ODT resistance of the selected memory device is fixed to the default value R2.

In S150, the memory controller 300 or the logic block 490 judges whether the selected memory device is a final memory device among the plurality of memory devices 210~280 or 410~480 or not. If an ODT setting of all the memory devices is completed, an overall process for the ODT setting is over. However, if memory devices which do not complete an ODT setting exist, a process returns to the S110 for selecting a memory device on which an ODT setting is not performed.

Figure 8A:
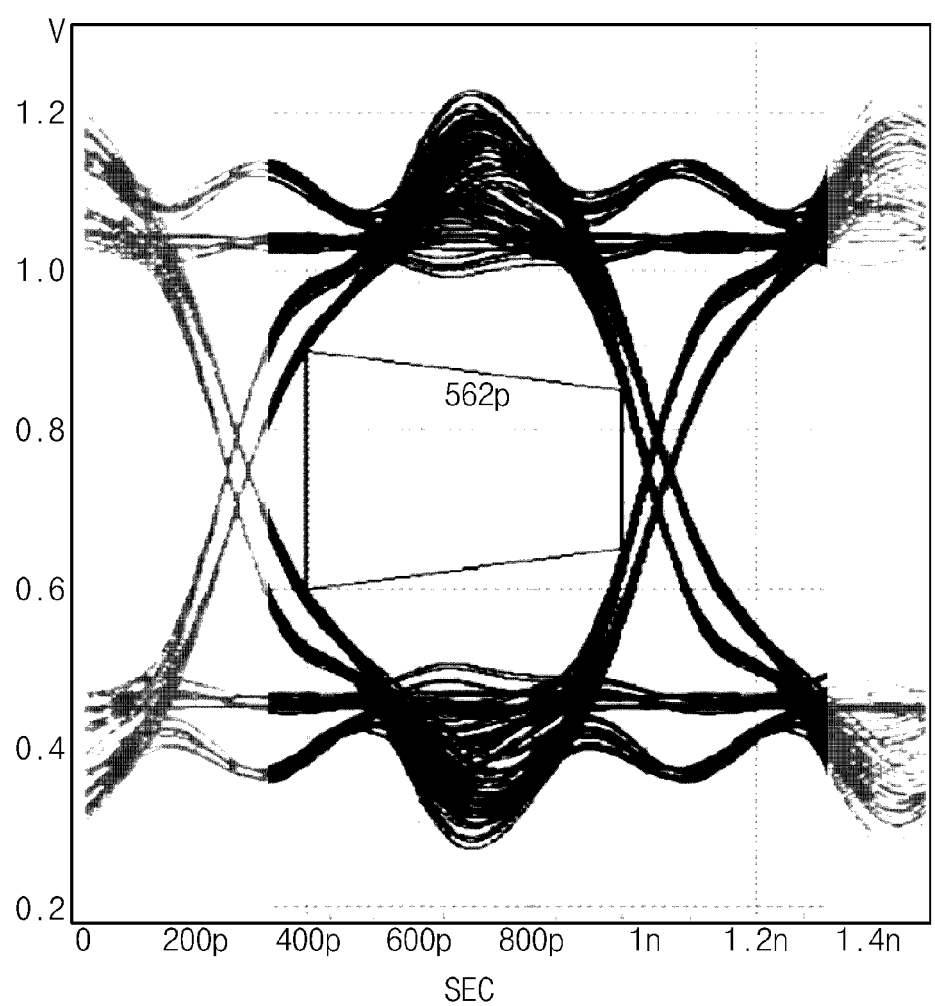
FIGS. 8A and 8B are example eye pattern diagrams showing a write operation according to one embodiment.
Figure 8B:
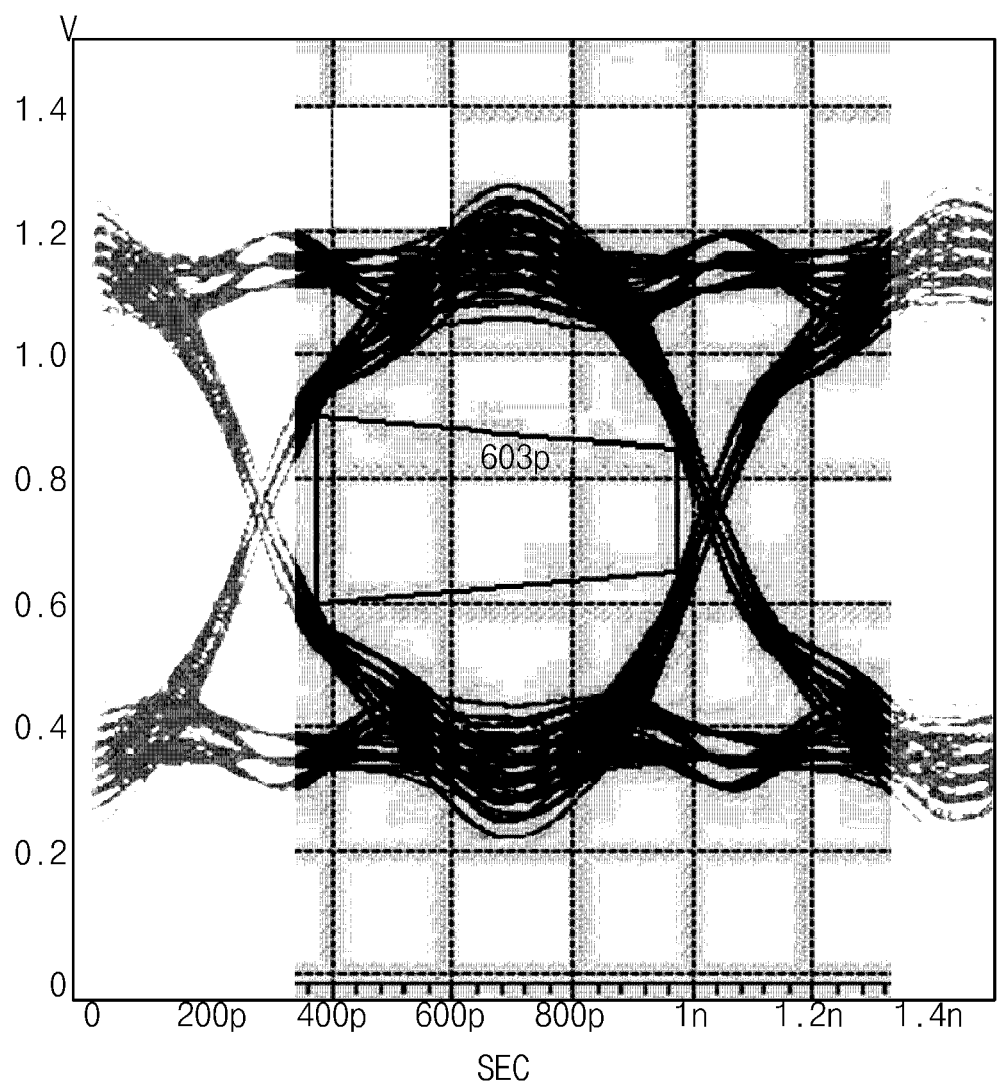

FIGS. 8A and 8B are eye pattern diagrams showing an exemplary effect when a write operation is performed. FIG. 8A is an eye pattern in the memory system which is observed when a data write operation is performed in the case that each of memory devices includes a stub resistor Rs regardless of a distance between the memory device and a connection pin. FIG. 8B is an eye pattern in a memory system in accordance with certain disclosed embodiments where a stub resistor Rs is selectively inserted in certain memory devices according to a distance between the memory device and a connection terminal when a data write operation is performed.

A noise margin or an opening width corresponding to a sampling possible section in an eye pattern of signals in accordance with the disclosed embodiments, as illustrated in FIG. 8B, is not greatly different from that illustrated in FIG. 8A. This means that the memory system of the disclosed embodiments is not greatly different from a conventional art including a stub resistor Rs in signal integrity or a transmission speed. According to some embodiments, even though the memory system does not partly include stub resistors Rs, it can sufficiently guarantee signal integrity.

According to some embodiments, since a number of stub resistors Rs of the memory system (or memory module) may be omitted, a module manufacturing cost may be reduced and a loading space of PCB substrate can be increased.

Figure 9A:
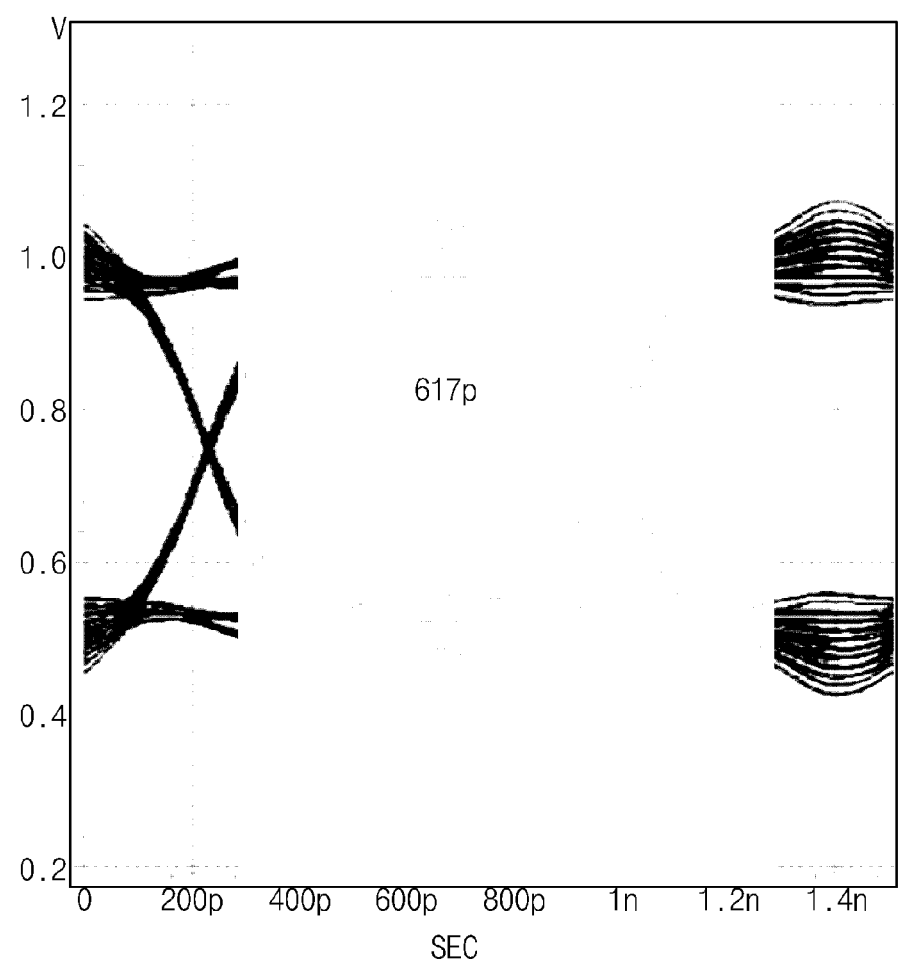
FIGS. 9A and 9B are eye pattern diagrams showing a read operation according to one exemplary embodiment.
Figure 9B:
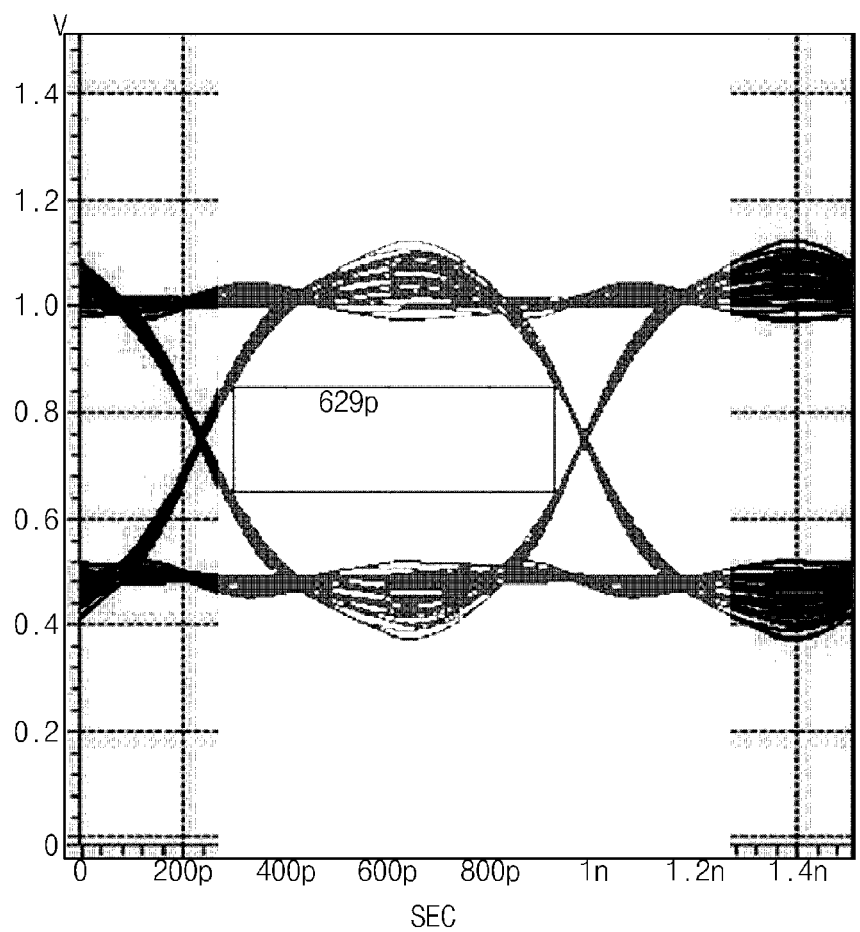

FIGS. 9A and 9B are eye pattern diagrams showing an effect of the disclosed embodiments when a read operation is performed. FIG. 9A is an eye pattern in the memory system which is observed when a data read operation is performed in the case that each of memory devices includes a stub resistor Rs regardless of a distance between the memory device and a connection terminal. FIG. 9B is an eye pattern in a memory system in accordance with some embodiments where a stub resistor Rs is selectively inserted in each of memory devices according to a distance between the memory device and a connection terminal when a data read operation is performed.

A noise margin or an opening width corresponding to a sampling possible section in an eye pattern of signal in accordance with the embodiments illustrated in FIG. 9B is not greatly different from that illustrated in FIG. 9A. This means that the memory system of the inventive concept is not greatly different from a conventional art including a stub resistor Rs in signal integrity or a transmission speed. According to some embodiments, even though the memory system does not partly include stub resistors Rs, it can sufficiently guarantee signal integrity.

According to some embodiments, since a stub resistor Rs of the memory system (or memory module) may be omitted, a module manufacturing cost may be reduced and a loading space of PCB substrate can be increased. Further, ODT resistances of the memory devices can be increased and thereby a standby power consumed in the memory devices can be reduced.

Figure 10:
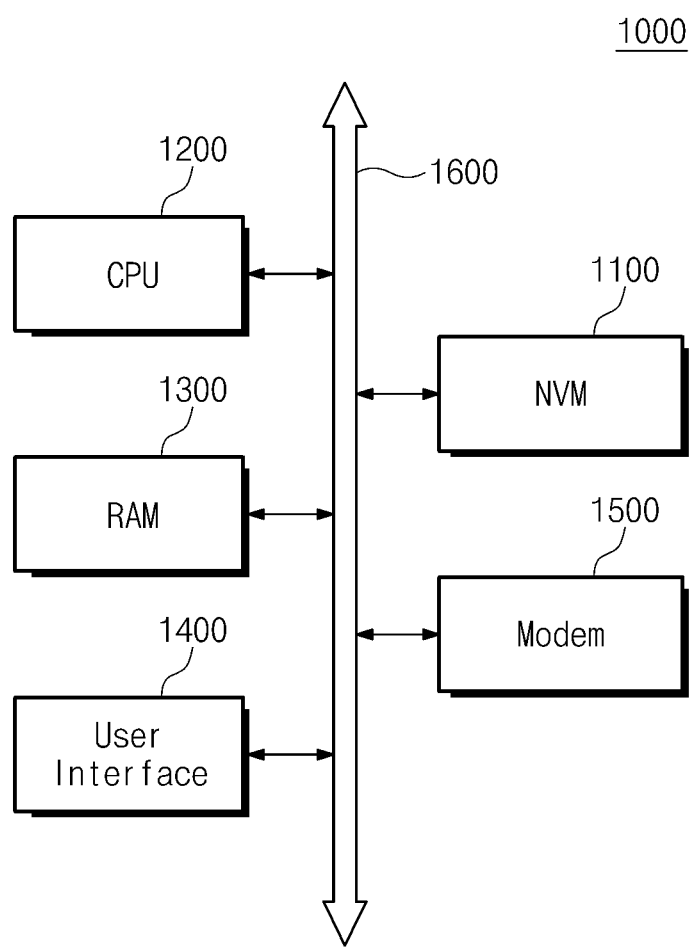
FIG. 10 is a block diagram illustrating a computing system including the memory system in accordance with example embodiments.

FIG. 10 is a block diagram illustrating an exemplary computing system including the memory system in accordance with some embodiments. A computing system 1000 may include a nonvolatile memory 1100, a central processing unit (CPU) 1200, a RAM 1300, a user interface 1400 and a modem 1500 such as a baseband chipset that are electrically connected to a system bus 1600.

The RAM 1300 may be a memory module provided, for example, in the form of single in-line memory module (SIMM), dual in-line memory module (DIMM) or small out-line dual in-line memory module (SoDIMM). In the memory module, stub resistors Rs may be inserted or omitted between connection terminals and a memory devices depending on a distance between the connection terminal and the memory device. In memory devices arranged in a plurality of rows based on a connection terminal, a stub resistor Rs may be inserted between a connection terminal and a memory device corresponding to any one row and a stub resistor Rs may be omitted between a connection terminal and a memory device corresponding to another row. Power consumption can be reduced without damaging signal integrity by increasing an ODT resistance of memory device for which a stub resistor Rs is not inserted between a connection terminal and the memory device.

If the computing system 1000 in accordance with the disclosed embodiments is a mobile device, a battery (not shown) for supplying an operation voltage of the computing system 1000 may be further provided. Although not illustrated in the drawing, it will be appreciated that an application chipset, a camera image processor (CIS), a mobile DRAM, etc. may be further provided.

The memory device or the memory system according to the disclosed embodiments can be mounted using various types of packages. A flash memory device and/or the memory controller in accordance with the disclosed embodiments can be mounted using packages such as PoP (package on package), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi chip package (MCP), wafer-level fabricated package (WFP) and wafer-level processed stack package (WSP).

According to some embodiments, a semiconductor memory system having a low power and high signal integrity can be provided.

The foregoing is illustrative and is not to be construed to be limiting of the invention. Although a few embodiments have been described, those skilled in the art will readily appreciate that many modifications are possible in the embodiments without materially departing from the novel teachings and advantages of the present invention. Accordingly, all such modifications are intended to be included within the scope of the present invention as defined in the claims. The present invention is defined by the following claims, with equivalents of the claims to be included therein.

What is claimed is:

1. A memory system comprising:
   a printed circuit board;
   a plurality of connection terminals formed on the printed circuit board; and
   a plurality of memory devices electrically connected to the plurality of connection terminals through a plurality of signal lines on the printed circuit board, wherein:
   the plurality of memory devices comprise: a first set of memory devices arranged in a first row of the printed circuit board; and a second set of memory devices arranged in a second row of the printed circuit board,
   a first memory device of the first set of memory devices is electrically connected to a first group of connection terminals of the plurality of connection terminals through a first group of signal lines, such that all of the connections between the first memory device of the first set of memory devices and connection terminals on the printed circuit board pass through the first group of signal lines,
   a first memory device of the second set of memory devices is electrically connected to a second group of connection terminals of the plurality of connection terminals through a second group of signal lines, such that all of the connections between the first memory device of the second set of memory devices and connection terminals on the printed circuit board pass through the second group of signal lines,
   no signal lines of the first group of signal lines connect to any stub resistors, and
   at least a first signal line of the second group of signal lines connects to a stub resistor.

2. The memory system of claim 1, wherein a distance between the first memory device of the first set of memory devices and its corresponding connection terminals is shorter than a distance between the first memory device of the second set of memory devices and its corresponding connection terminals.

3. The memory system of claim 2, wherein each of the plurality of memory devices comprises an on-die termination circuit to control a terminating resistance and the terminating resistance of each of the first memory devices is set to be greater than that of each of the second memory devices.

4. The memory system of claim 3, further comprising a series constitution perception device configured for setting a terminating resistance of an on-die termination circuit of each of the memory devices.

5. The memory system of claim 4, wherein the series constitution perception device stores row information of each of the memory devices or information for each of the plurality of memory devices indicating whether or not it is connected to at least one external connection terminal of the PCB via a stub resistor.

6. The memory system of claim 3, further comprising control logic for setting a terminating resistance of an on-die termination circuit of each of the memory devices according to a row wherein the memory device is located.

7. The memory system of claim 1, wherein:
   the first memory device of the first set of memory devices and the first memory device of the second set of memory devices are identical devices;
   a first external device terminal of the first memory device and a first external device terminal of the second memory device are configured to send and receive the same type of signal;
   the first external device terminal of the first memory device connects to a connection terminal of the plurality of connection terminals through a signal line and not through a stub resistor; and
   the first external device terminal of the second memory device connects to a connection terminal of the plurality of connection terminals through a stub resistor.

8. The memory system of claim 7, wherein:
   the same type of signal is one of a data signal, a strobe signal, or a chip select signal.

9. A memory module comprising:
   a printed circuit board (PCB) including a plurality of signal lines, and including a plurality of external connection terminals extending to a first edge of the PCB;
   a plurality of memory devices mounted on the PCB, the plurality of memory devices including a first set of memory devices arranged in a first row and a second set of memory devices arranged in a second row further away from the plurality of external connection terminals than the first row;
   a first memory device that is part of the first set of memory devices, the first memory device including a plurality of external device terminals, wherein at least a first external device terminal of the first memory device is connected to circuitry of the first memory device configured to transmit a first type of signal;
   a second memory device that is part of the second set of memory devices, the second memory device including a plurality of external device terminals, wherein at least a first external device terminal of the second memory device is connected to circuitry of the second memory device configured to transmit the first type of signal;
   a first signal line connected between the first external device terminal of the first memory device and a first external connection terminal of the plurality of external connection terminals, and no stub resistor connected between the first external device terminal of the first memory device and the first external connection terminal of the plurality of external connection terminals; and
   a second signal line connected between the first external device terminal of the second memory device and a second external connection terminal of the plurality of external connection terminals, and a stub resistor connected between the first external device terminal of the second memory device and the second external connection terminal of the plurality of external connection terminals.

10. The memory module of claim 9, wherein:
the first type of signal is a data signal.

11. The memory module of claim 10, wherein:
the first memory device and the second memory device are identical devices; and
the first external device terminal of the first memory device and the first external device terminal of the second memory device are located at the same location in each respective memory device.

12. The memory module of claim 9, wherein:
the first signal line has a shorter length than the second signal line.

13. The memory module of claim 9, wherein:
the first signal line has a lower impedance than the second signal line.

14. The memory module of claim 9, wherein each of the first and second memory devices comprises an on-die termination circuit to control a terminating resistance and the terminating resistance of the first memory device is set to be greater than that of the second memory device.

15. The memory module of claim 14, further comprising a series constitution perception device configured for setting a terminating resistance of an on-die termination circuit of each of the plurality of memory devices.

16. The memory module of claim 15, wherein the series constitution perception device stores row information for each of the plurality of memory devices or information for each of the plurality of memory devices indicating whether or not it is connected to at least one external connection terminal of the PCB via a stub resistor.

17. The memory module of claim 14, further comprising control logic for setting a terminating resistance of an on-die termination circuit of each of the plurality of memory devices according to a row wherein the memory device is located.

18. The memory module of claim 9, wherein:
the first signal line is part of a first group of signal lines connected between the first external device terminal of the first memory device and a respective first group of external connection terminals of the plurality of external connection terminals, each signal line of the first group of signal lines not connected to a stub resistor; and
the second signal line is part of a second group of signal lines connected between the first external device terminal of the second memory device and a respective second group of external connection terminals of the plurality of external connection terminals, each signal line of the second group of signal lines connected to a stub resistor.

19. A memory system comprising:
a plurality of memory devices on a printed circuit board, each of the memory devices including a plurality of external pads;
a plurality of connection terminals formed on the printed circuit board, and electrically connected to respective ones of the external pads; and
a plurality of signal lines formed on the printed circuit board to connect the connection terminals with the external pads, each of the signal lines between a corresponding connection terminal and a corresponding external pad and having a length,
wherein the plurality of memory devices are arranged at different distances from the plurality of connection terminals, and
wherein each signal line that connects a connection terminal to an external pad of a memory device either is connected to or does not connect a stub resistor depending on a length of the line.

* * * * *